United States Patent [19]
Chen

[11] Patent Number: 6,157,218
[45] Date of Patent: Dec. 5, 2000

[54] PHASE-FREQUENCY DETECTION WITH NO DEAD ZONE

[75] Inventor: Mu-jung Chen, Hsinchu, Taiwan

[73] Assignee: Realtex Semiconductor Corp., Hsinchu, Taiwan

[21] Appl. No.: 09/352,768

[22] Filed: Jul. 14, 1999

[51] Int. Cl.[7] .................................................. G01R 25/00
[52] U.S. Cl. ...................................................... 327/7; 327/5
[58] Field of Search .................................... 327/2, 3, 5, 7, 327/8, 9, 10, 12

[56] References Cited

U.S. PATENT DOCUMENTS 4,764,737  8/1988  Kaatz ........................................ 331/1 A
5,939,901  8/1999  Geddes ......................................... 327/3

Primary Examiner—Tuan T. Lam
Assistant Examiner—Linh Nguyen
Attorney, Agent, or Firm—Bacon & Thomas, PLLC

[57] ABSTRACT

The present invention relates to a phase detector with no dead zone comprising two detecting means and two control logic circuits. The phase-frequency detector employs the control logic circuits to proceed with reset operation of the detecting means such that the existence of a phase difference between the reference clock signal and the feedback clock signal prevents the misdetection of the up, down signals (output signal), and the up, down signals will not be simultaneously at "1".

5 Claims, 4 Drawing Sheets

PHASE-FREQUENCY DETECTION WITH NO DEAD ZONE

BACKGROUND OF THE INVENTION (a) Technical Field of the Invention

The present invention relates to a phase-frequency detector, and in particular, to a phase-frequency detector with no dead zone used in a phase-locked loop.

(b) Description of the Prior Art

As a result of upgrading network transmission technology and the needs of network users, the data transmission rate is being upgraded continuously. For instance, with regard to the application range of IEEE 1394a, the maximum transmission rate is 400 MHz, and it employs data strobe coding method in data transmission. As shown in FIG. 1, the transmission signal during data transmission includes a data signal and a strobe signal, and when the data is read, the clock signal which is used to recover the data is derived from the result of the exclusive OR operation of the data signal and the strobe signal received by the receiving end (Data XOR Strobe signal).

With respect to the above, during the data transmission and reading data process, a phase-locked loop is employed to generate a stable clock signal. If the phase-locked loop generates a clock signal with undesired jitter, the duty cycle of the clock signal (Data XOR Strobe signal) produced by the receiving end will not be accurate, which will increase the bits error rate of the received data. Thus, during the data transmission and data recovery process, it is very important that the phase-locked loop generates stable clock signals. In other words, for accurate data transmission, the clock signal generated by the phase-locked loop must have very low jitter. The jitter of the clock signal is closely related with the phase-frequency detector in the phaselocked loop.

FIG. 2 illustrates the block diagram of a conventional phase-locked loop 1, which comprises a phase-frequency detector 11, a charge pump 12, a voltage controlled oscillator 13 and a frequency divider 14. The phase-frequency detector 11 receives a reference clock signal $CK_{ref}$ from the outside and a feedback clock signal $CK_{vco}$ from the frequency divider 14, compares the phase and the frequency of the two signals, and then outputs the up, dn signals to control the charge pump 12.

The charge pump 12, based on the control signal up, dn output from the above phase-frequency detector 11, provides an appropriate output voltage Vc to the voltage controlled oscillator 13. The voltage controlled oscillator 13, based on the above voltage Vc, outputs a clock signal. The frequency divider 14 receives the clock signal and outputs a feedback clock signal, denoted by $CK_{vco}$, with frequency divided by some number. The feedback clock signal is used as the input signal of the phase-frequency detector 11.

With respect to the aforementioned phase-locked loop 1, the phase-frequency detector 11 comprises two D flip-flops 111, 112 and an AND gate 113 (as shown in FIG. 3(a)). The output terminal of the AND gate 113 is connected to the reset 15 terminals of the D flip-flops 111, 112 respectively. With such a structure, if the reference clock signal $CK_{ref}$ and the feedback clock signal $CK_{vco}$ shown in FIG. 3(b) are respectively input into the D flip-flops 111, 112, the D flip-flop 111 will theoretically produce a $Q_A$ signal as shown in FIG. 3(b), where the signal $CK_{ref}$ is ahead of signal $CK_{vco}$. Theoretically, only the signal of $Q_A$ is at "1". However, in practice, when signal $CK_{ref}$ changes from "0" to "1", $Q_A$ will be at "1". When signal $CK_{vco}$ changes from "0" to "1", $Q_B$ will be at "1" instantaneously. At this moment, the signals $Q_A$, and $Q_B$ are simultaneously at "1". Thus, the output signals of the D flip-flops 111, 112 are reset, and $Q_A$, and $Q_B$ will be lowered to "0", which is further explained as follows.

The phase-frequency detector 11 comprises an AND gate 113, due to its delay, the output $Q_A$ and $Q_B$ are both at "1" in a short moment (i.e. the delay time of the AND gate) regardless of the phase difference between the reference clock signal $CK_{ref}$ and the feedback clock signal $CK_{vco}$. At this moment, if the phase difference between $CK_{ref}$ and $CK_{vco}$ is very small, and the load of $Q_A$ and $Q_B$ is large, then their signals will attenuate and will not drive the AND gate 113 or transmit the signals, thereby causing misdetection of the signal. In other words, the phase-frequency detector 11 will produce the clock jitter phenomenon. This undetectable range of phase difference is known as a dead zone of the phase-frequency detector 11, which is shown as range ±x in FIG. 4.

Accordingly, the scope of the dead zone has to be reduced first in order to reduce the clock jitter.

SUMMARY OF THE INVENTION

Accordingly, the main object of the present invention to provide a phase-frequency detector with no dead zone having detectable smallest phase difference.

In order to achieve the above-mentioned object, the present invention comprises a first detecting means, a second detecting means, a first control logic circuit and a second control logic circuit, wherein the first detecting means includes a clock signal receiving terminal to receive the reference clock signal input from the outside, a reset signal receiving terminal to receive reset signal which is capable of resetting the first detecting means, and an output terminal to output a control signal (up signal). The second detecting means includes a clock signal receiving terminal to receive the feedback clock signal from the frequency divider, a reset signal receiving terminal to receive reset terminal which is capable of resetting the second detecting means, and an output terminal to output a control signal (dn signal). The first control logic circuit is used to receive the control signal (up signal) output from the first detecting means, the feedback clock signal from the frequency divider, and the control signal (dn signal) output from the second detecting means. It will produce a reset signal based on the rising edge of the feedback clock signal and dn signal, to be input into the reset signal receiving terminal of the first detecting means. The second control logic circuit is used to receive the control signal (up signal) output from the first detecting means, the reference clock signal output from the outside, and the control signal output from the second detecting means. It will produce a reset signal based on the rising edge of the reference clock signal and up signal to be input into the reset signal receiving terminal of the second detecting means.

In the present phase-frequency detector, the phase difference between the reference clock signal input from the outside and the feedback clock signal from the frequency divider, ensures that the control signals (up, dn signal) are not simultaneously at "1" or "0". In other words, the present phase-frequency detector does not comprise a dead zone.

Thus, the phase-locked loop containing such a phase-frequency detector will greatly reduce the jitter phenomenon during the output of the clock signal, thereby reducing the bit error rate of the received signal.

Other objects, advantages & characteristics of this invention will be described more clearly with the descriptions of the preferred embodiments in conjunction with the accompanying drawings.

DETAILED DESCRIPTION OF THE PREFERRED EMBODIMENT

Figure 1:
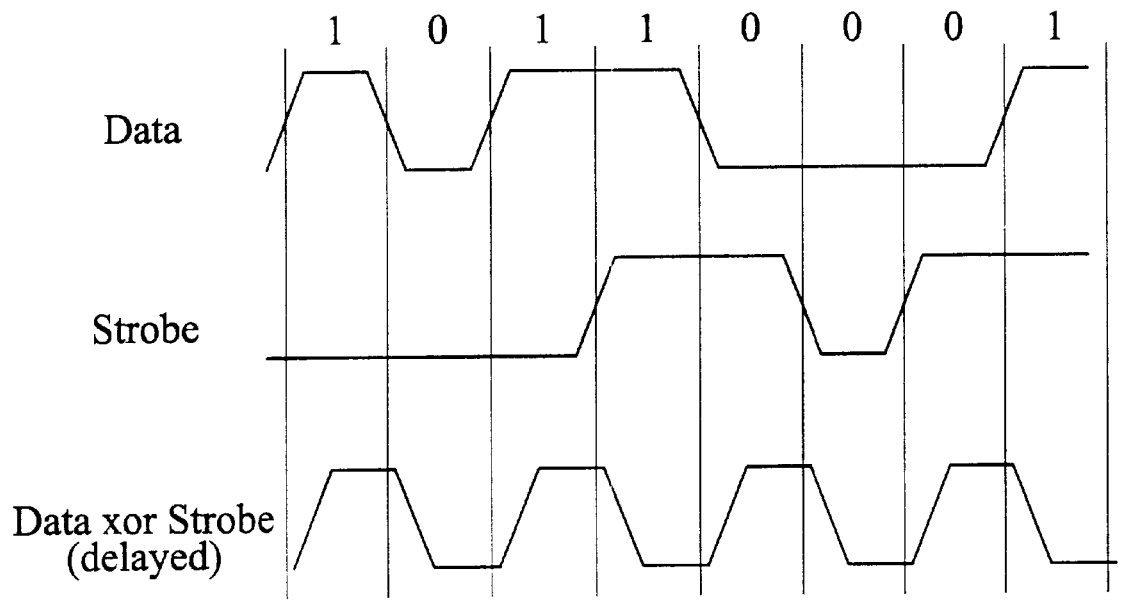
FIG. 1 illustrates the forms of data employing data strobe coding method.
Figure 2:
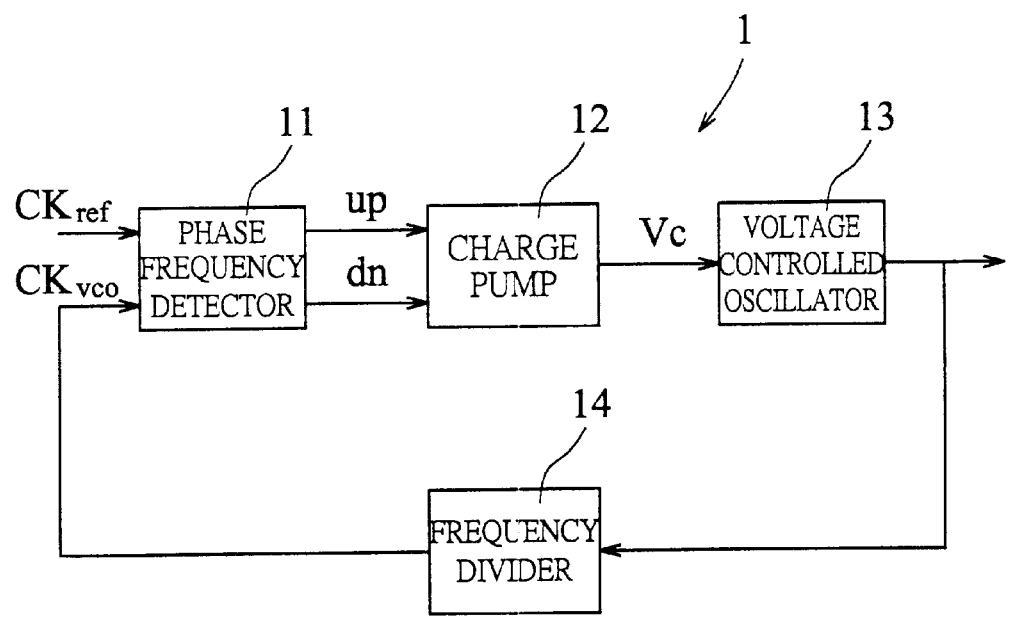
FIG. 2 is a block diagram illustrating a conventional phase-locked loop.
Figure 3A:
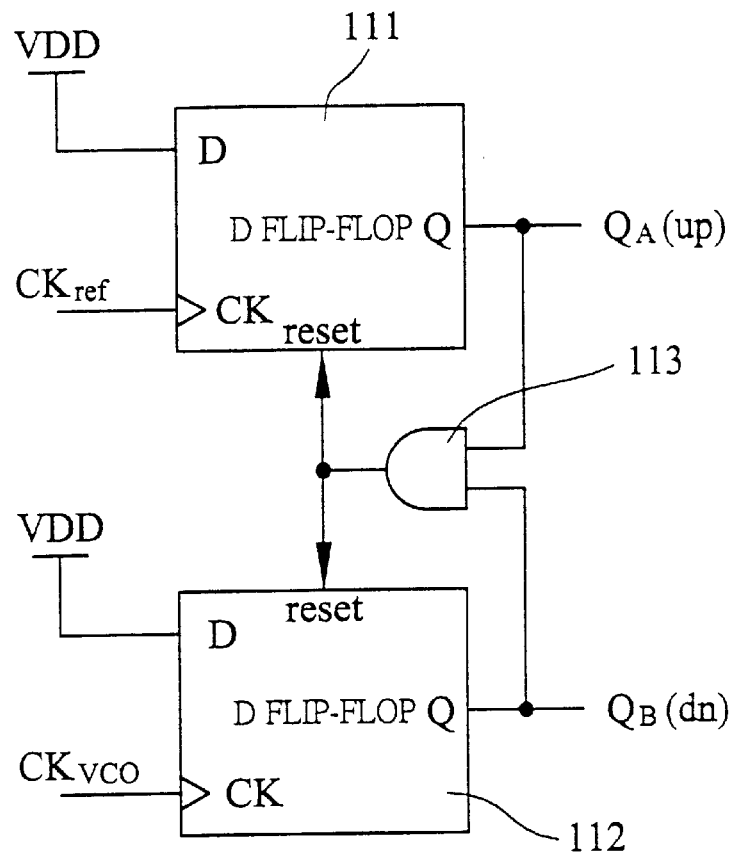
FIG. 3(a) is a circuit diagram of a conventional phase-locked loop phase-frequency detector.
Figure 3B:
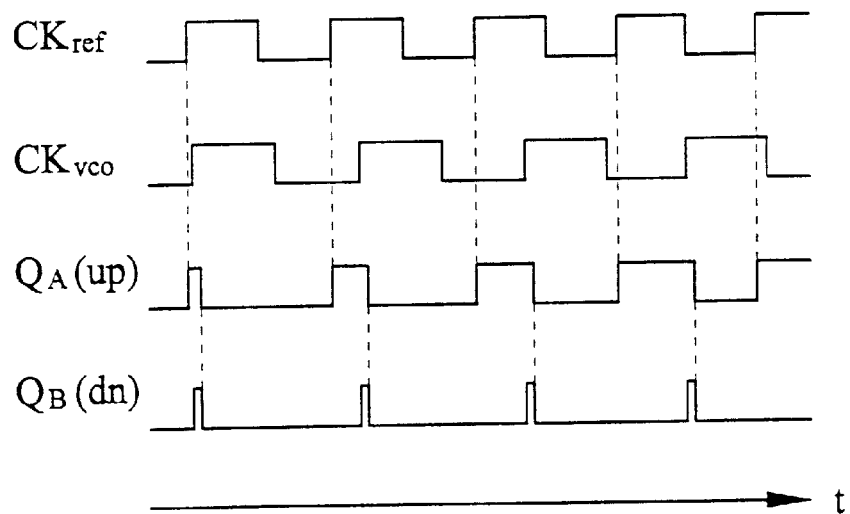
FIG. 3(b) illustrates the state of output and input clock signal of the phase-frequency detector of FIG. 3(a).

As shown in the drawings, the present invention relates to a phase-frequency detector used in a phase-locked loop. Therefore, the related circuit of the phase-frequency detector of the present invention employs a partial conventional phases-locked loop. For the purpose of illustration, the similar parts of the present phase-locked loop and that of the conventional phase-locked loop are omitted, and a part of the numeral references are employed.

Figure 5A:
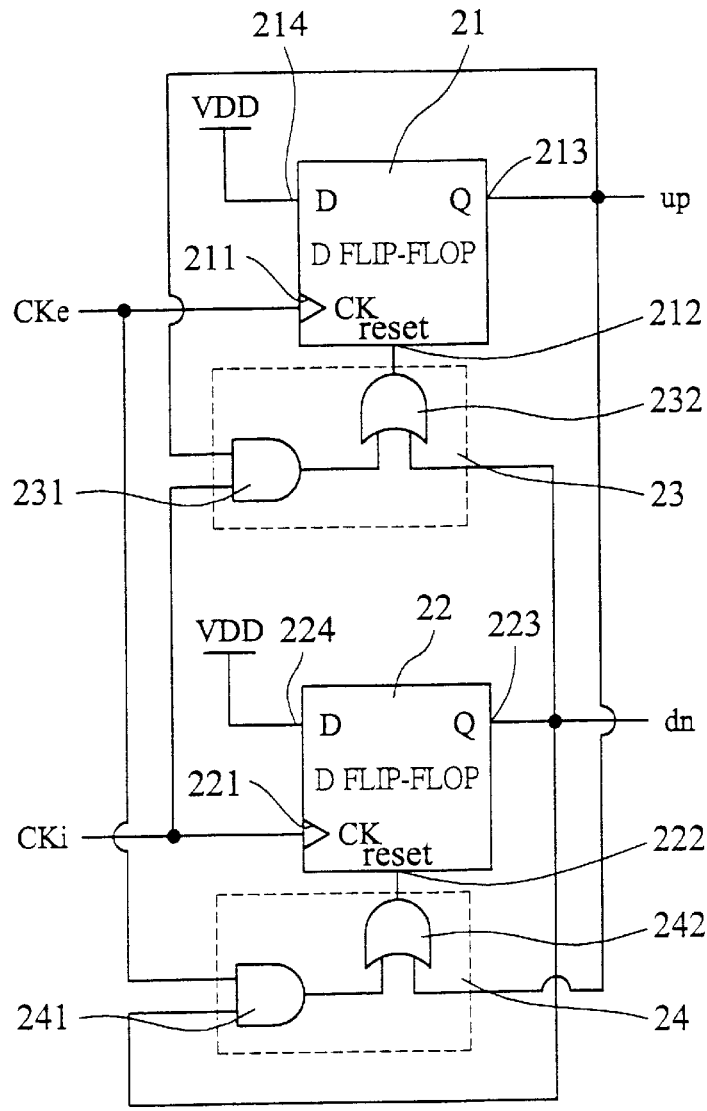
FIG. 5(a) is a circuit diagram of the phase-frequency detector of the present invention.

FIG. 5(a), shows a phase-frequency detector comprising a first detecting means 21, a second detecting means 22, a first control logic circuit 23, and a second control logic circuit 24. In accordance with the present invention, the first detecting means 21 is a D flip-flop comprising a clock signal receiving terminal 211 to receive the clock signal $CK_{ref}$, a reset signal receiving terminal 212 to receive reset signal which is capable of resetting the first detecting means to 21, an output terminal 213 to output control signal (up signal); and a data terminal 214 preset at "1". The second detecting means 22 is also a D flip-flop comprising, a clock signal receiving terminal 221 to receive the other clock signal $CK_i$; a reset signal receiving terminal 222 to receive reset signal which is capable of resetting the second detecting means 22; an output terminal 223 to output a control signal (a dn signal) and a data terminal 224 preset at "1".

The first control logic circuit 23 comprises an AND gate 231 and an OR gate 232. The control signal (up signal) output by the first detecting means 21 and the clock signal $CK_i$ are input into the AND gate 231. The output signal of the AND gate 231 and the control signal (dn signal) output from the second detecting means 22 are input into the OR gate 232. Based on the input signals, the OR gate 232 outputs a signal which serves as a reset signal, and the signal is input into the reset signal receiving terminal 212 of the first detecting means 21.

The second control logic circuit 24 comprises an AND gate 241 and an OR gate 242 to receive the clock signal $CK_e$ and to receive the control signal (dn signal) output from the second detecting means 22.

These signals are input into the AND gate 241, and the control signal (up signal) output from the first detecting means 21 are input into the OR gate 242. Based on the input signals, the OR gate 242 outputs a signal which serves as a reset signal and these signals are input into the reset signal receiving terminal 222 of the second detecting means 22.

Figure 5B:
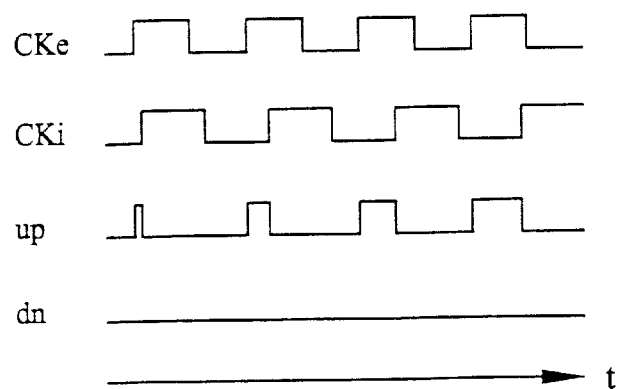
FIG. 5(b) illustrates the state of the output and input clock signals of the phase-frequency detector of FIG. 5(a) of the present invention.

In accordance with the present invention, FIG. 5(b) illustrates the operation of the phase-frequency detector. The phase illustrated by the clock signal $CK_e$ of FIG. 5(b) is ahead of the phase of the clock signal CKi. Thus, when the clock signal $CK_e$ changes from "0" to "1", it drives the control signal (up signal) output from the first detecting means 21 to "1", and the other control signal (dn signal) output from the second detecting means 22 is reset to "0" by up signal. The up signal will change to "0" only when the clock signal $CK_i$ changes to "1", and the dn signal remains at "0".

In other words, when there is a phase difference between the clock signal $CK_e$ and the clock signal $CK_i$, the phase-frequency detector of the present invention will drive only one of the output signals (up, dn signal) of the first detecting means 21 and the second detecting means 22 to "1", and erase the other of the output signals with the help of the operation of the first control logic circuit 23 and the second control logic circuit 24. Accordingly, the up and dn signal will not be simultaneously at "1". Thus, when the clock signal $CK_e$ and the clock signal $CK_i$ are synchronized, and are at the same frequency, the output signals (up, dn) will be temporarily at "1" as a result of delay in the logic gate. However, the charging and discharging at the next level will be cancelled, thus, the Vc value will not be affected. Moreover, as the circuits of the phase-frequency detector of the present invention are symmetrical, they will have the same aforementioned effect when the reference clock signal $CK_e$ lags behind the clock signal $CK_i$.

With respect to the above, in the phase-frequency detector of the present invention, the existence of a phase difference between the reference clock signal $CK_e$ output from the outside and the feedback clock signal $CK_i$ from the frequency divider, ensures that the control signal (up, down signal) are not simultaneously at "1" or "0". In other words, the phase-frequency detector of the present invention has no dead zone.

Figure 6:
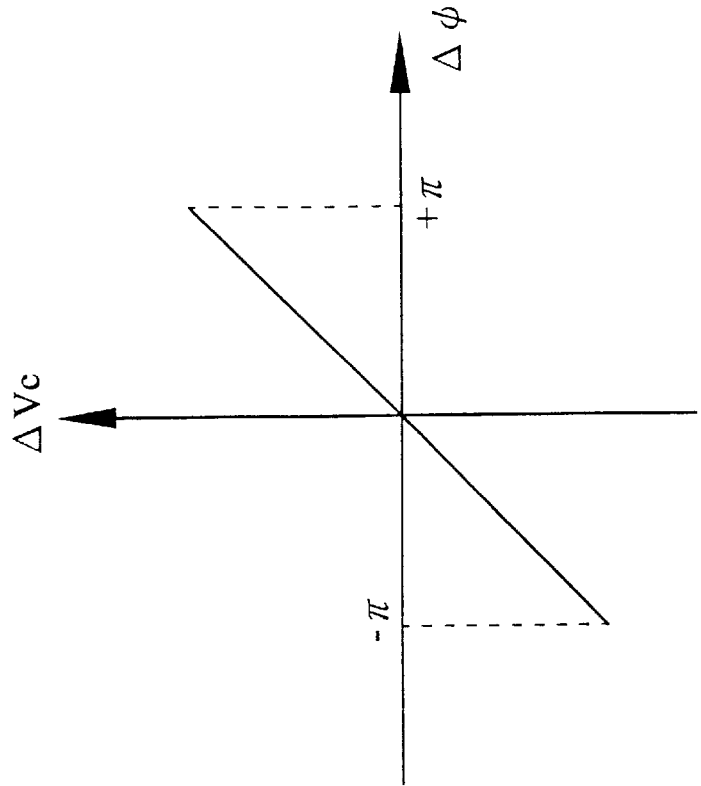
FIG. 6 shows the relationship of the phase difference detected by the phase-frequency detector of FIG. 5(a) and the output voltage variation $V_c$ of the charge pump having filtering function in accordance with the present invention.
Figure 4:
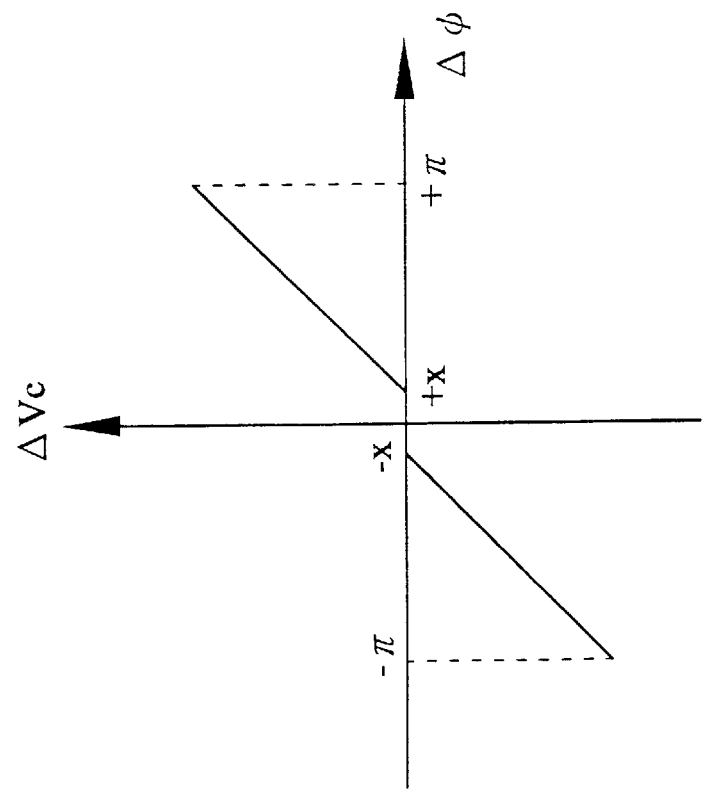
FIG. 4 shows the relationship of the phase difference detected by the phase-frequency detector of FIG. 3(a) and the output voltage variation VC of the charge pump having filtering function of the present invention.

As shown in FIG. 6, there is a linear relationship between the phase difference (which is detected by the phase-frequency detector), and the output voltage variation $V_c$ of the charge pump having a filtering function. Thus, the phase-locked loop containing such phase-frequency detector will greatly reduce the jitter phenomenon during the output of clock signal, thereby reducing the bit error rate of the received signal.

While the invention has been described by way of example and it is to be understood that the invention is not limited to the disclosed preferred embodiment. On the contrary, it is intended to cover various modifications and similar arrangements as would be apparent to those skilled in the art. Therefore, the scope of the appended claims, which define the invention, should be accorded the broadest interpretation as to encompass all such modifications and similar structures.

What is claimed is:

1. A phase-frequency detector with no dead zone which is used in a phase-locked loop comprising:

(a) a first detecting means including a clock signal receiving terminal to receive reference clock signal input from the outside, a reset signal receiving terminal to receive reset signal which is capable of resetting the first detecting means, and an output terminal to output a control signal (up signal);

(b) a second detecting means including a clock signal receiving terminal to receive the clock signal whose frequency within the interior of the phase-locked loop has been divided, a reset signal receiving terminal to receive reset terminal which is capable of resetting the second detecting means, and an output terminal to output a control signal (dn signal);

(c) a first control logic circuit for receiving the control signal (up signal) output from the first detecting means, and the clock signal whose frequency within the interior of the phase-locked loop has been divided, and the control signal (dn signal) output from the second detecting means, and to produce a reset signal in accordance with the clock signal, to be input into the reset signal receiving terminal of the first detecting means; and (d) a second control logic circuit for receiving the control signal (up signal) output from the first detecting means, and the reference clock signal to produce a reset signal in accordance with the reference clock signal to be input into the reset signal receiving terminal of the second detecting means.

2. A phase-frequency detector with no dead zone according to claim 1, wherein the first detecting means is a D flip-flop.

3. A phase-frequency detector with no dead zone according to claim 1, wherein the second detecting means is a D flip-flop.

4. A phase-frequency detector with no dead zone according to claim 1, wherein the first control logic circuit comprises an AND gate and an OR gate, and the control signal (up signal) output from the first detecting means and the clock signal whose frequency within the phase-locked loop has been divided are input to the AND gate, and the output signal of the AND gate and the control signal (dn signal) output from the second detecting means are input to the OR gate, and the output terminal of the OR gate is connected to the reset signal receiving terminal of the first detecting means.

5. A phase-frequency detector with no dead zone according to claim 1, wherein the second control logic circuit comprises an AND gate and an OR gate, the control signal (down signal) output from the second detecting means and the reference clock signal input from the outside are input to the AND gate, and the output signal of the AND gate and the control signal (up signal) output from the first detecting means are input to the OR gate, and the output terminal of the logic gate is connected to the reset signal receiving terminal of the second detecting means.

* * * * *

UNITED STATES PATENT AND TRADEMARK OFFICE
CERTIFICATE OF CORRECTION

PATENT NO.    : 6,157,218
DATED         : December 5, 2000
INVENTOR(S)   : Mu-Jung Chen It is certified that error appears in the above-identified patent and that said Letters Patent is hereby corrected as shown below:

<u>Title page,</u>
Item [73], should read as follows, -- [73] Assignee: Realtek Semiconductor Corp. Hsinchu, Taiwan Signed and Sealed this Twenty-third Day of April, 2002

Attest:

Attesting Officer

JAMES E. ROGAN
Director of the United States Patent and Trademark Office